United States Patent
Jeong et al.

(10) Patent No.: US 11,244,716 B2
(45) Date of Patent: Feb. 8, 2022

(54) MEMORY DEVICES CONFIGURED TO DETECT INTERNAL POTENTIAL FAILURES

(71) Applicant: Samsung Electronics Co., Ltd., Suwon-si (KR)

(72) Inventors: Jinseok Jeong, Hwaseong-si (KR); Eunju Gi, Seoul (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 17/016,481

(22) Filed: Sep. 10, 2020

(65) Prior Publication Data
US 2021/0193213 A1    Jun. 24, 2021

(30) Foreign Application Priority Data
Dec. 19, 2019  (KR) .................... 10-2019-0170409

(51) Int. Cl.
| | |
|---|---|
| *G11C 8/10* | (2006.01) |
| *G11C 11/408* | (2006.01) |
| *G11C 11/4074* | (2006.01) |
| *G11C 11/4096* | (2006.01) |
| *G11C 11/4091* | (2006.01) |
| *G11C 29/02* | (2006.01) |
| *G11C 29/00* | (2006.01) |
| *G11C 29/44* | (2006.01) |
| *G11C 29/12* | (2006.01) |

(52) U.S. Cl.
CPC ............ *G11C 11/4085* (2013.01); *G11C 8/10* (2013.01); *G11C 11/4074* (2013.01); *G11C 11/4087* (2013.01); *G11C 11/4091* (2013.01); *G11C 11/4096* (2013.01); *G11C 29/00* (2013.01); *G11C 29/024* (2013.01); *G11C 29/025* (2013.01); *G11C 29/4401* (2013.01); *G11C 29/81* (2013.01); *G11C 2029/1202* (2013.01)

(58) Field of Classification Search
CPC ............ G11C 11/4085; G11C 11/4074; G11C 11/4096; G11C 11/4091; G11C 11/4087; G11C 29/00; G11C 29/024; G11C 8/08; G11C 8/10
See application file for complete search history.

(56) References Cited

U.S. PATENT DOCUMENTS

| | | | |
|---|---|---|---|
| 5,606,527 A | 2/1997 | Kwack et al. | |
| 6,154,399 A * | 11/2000 | Ogishima | G11C 29/802 365/200 |

(Continued)

*Primary Examiner* — Mushfique Siddique
(74) *Attorney, Agent, or Firm* — Myers Bigel, P.A.

(57) ABSTRACT

A memory device includes a memory cell array including a plurality of memory cells connected to a plurality of wordlines and a plurality of bitlines, a wordline driving circuit including a plurality of sub-wordline decoders respectively connected to the plurality of wordlines, wherein each of the sub-wordline decoders is configured to input a first driving signal to the respectively connected wordline when the wordline is selected, and wherein each sub-wordline decoder is configured to input a predetermined power supply voltage to the respectively connected wordline when the wordline is unselected, The memory device may include a sense amplifier circuit including sense amplifiers connected to the bitlines, and a logic circuit configured to determine a failure of at least one of the memory cell array and the wordline driving circuit.

18 Claims, 14 Drawing Sheets

(56) References Cited

U.S. PATENT DOCUMENTS

| | | | |
|---|---|---|---|
| 6,188,620 B1* | 2/2001 | Shibuya | G11C 8/08 365/200 |
| 7,715,259 B2 | 5/2010 | Lee et al. | |
| 8,432,732 B2 | 4/2013 | Li et al. | |
| 8,488,380 B2 | 7/2013 | Do | |
| 2006/0087906 A1 | 4/2006 | Rehm et al. | |
| 2007/0223283 A1* | 9/2007 | Matsubara | G11C 8/14 365/185.23 |
| 2008/0080296 A1 | 4/2008 | Lee et al. | |
| 2008/0304344 A1 | 12/2008 | Do | |
| 2011/0032785 A1* | 2/2011 | Cho | G11C 8/08 365/230.06 |
| 2011/0176375 A1* | 7/2011 | Lee | G11C 8/08 365/194 |
| 2012/0033516 A1 | 2/2012 | Do | |
| 2013/0107640 A1 | 5/2013 | Yamada | |
| 2014/0347951 A1* | 11/2014 | Kim | G11C 7/02 365/230.06 |

* cited by examiner

MEMORY DEVICES CONFIGURED TO
DETECT INTERNAL POTENTIAL FAILURES

CROSS-REFERENCE TO RELATED
APPLICATION(S)

This application claims the benefit of priority under 35 U.S.C. § 119 to Korean Patent Application No. 10-2019-0170409, filed on Dec. 19, 2019, in the Korean Intellectual Property Office, the disclosure of which is incorporated by reference herein in its entirety.

BACKGROUND

The present disclosure relates to memory devices.

A memory device may provide functions including writing data, reading written data, and/or erasing data. A memory device may include a plurality of memory cells and a memory controller, and the memory cells may be connected to the memory controller through wordlines and bitlines. As the integration density of memory devices is increased, various failures may occur or may potentially occur in the memory cells, the memory controller, and/or in the wordlines and bitlines.

SUMMARY

Aspects of the present disclosure provide memory devices which may effectively detect internal potential failures to improve quality thereof.

According to some example embodiments, a memory device includes a memory cell array including a plurality of memory cells connected to a plurality of wordlines and a plurality of bitlines, a wordline driving circuit including a plurality of sub-wordline decoders connected respectively to the plurality of wordlines, wherein each of the sub-wordline decoders is configured to input a first driving signal to the respectively connected wordline when the wordline is selected, and each sub-wordline decoder is configured to input a predetermined power supply voltage to the respectively connected wordline when the wordline is unselected. A sense amplifier circuit including sense amplifiers is connected to the bitlines, and a logic circuit is configured to determine a failure of at least one of the memory cell array and the wordline driving circuit by floating unselected sub-wordline decoders while the first driving signal is input to the selected wordline, and detecting data of unselected memory cells connected to the unselected wordlines using at least one of the sense amplifiers.

According to some example embodiments, a memory device includes a memory cell array including a plurality of memory cells connected to a plurality of wordlines and a plurality of bitlines, a wordline driving circuit including sub-wordline decoders connected to the wordlines, wherein each of the sub-wordline decoders is connected to a power line, and is configured to output a predetermined power supply voltage, through a power switch, and a logic circuit configured to control the power switch.

According to some example embodiments, a memory device includes a plurality of memory cells connected to a plurality of wordlines and a plurality of bitlines, connection circuits configured to generate a driving signal to drive the memory cells, sub-wordline decoders connected between the connection circuits and the plurality of wordlines and configured to determine a selected wordline and unselected wordlines from the plurality of wordlines, and a logic circuit configured to control the sub-wordline decoders such that a power supply voltage is input to the plurality of wordlines during a first time and to control the sub-wordline decoders such that a driving voltage, higher than the power supply voltage, is input to the selected wordline and the unselected wordlines are floated during a second time subsequent to the first time.

BRIEF DESCRIPTION OF DRAWINGS

The above and other aspects, features, and advantages of the present disclosure will be more clearly understood from the following detailed description, taken in conjunction with the accompanying drawings.

DETAILED DESCRIPTION

Hereinafter, some example embodiments of the inventive concepts will be described with reference to the accompanying drawings.

Figure 1:
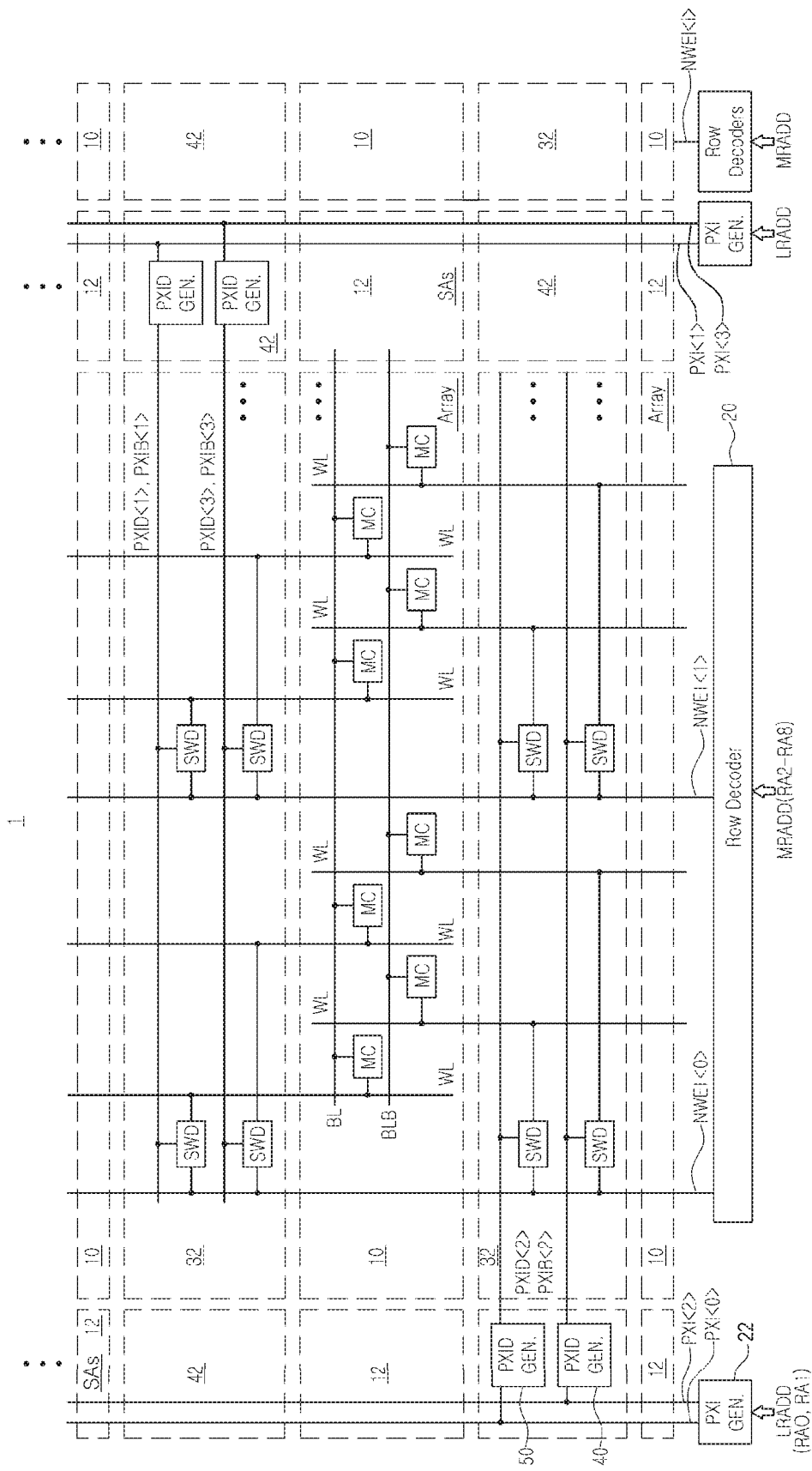
FIGS. 1 and 2 are schematic diagrams of a memory device according to some example embodiments.
Figure 2:
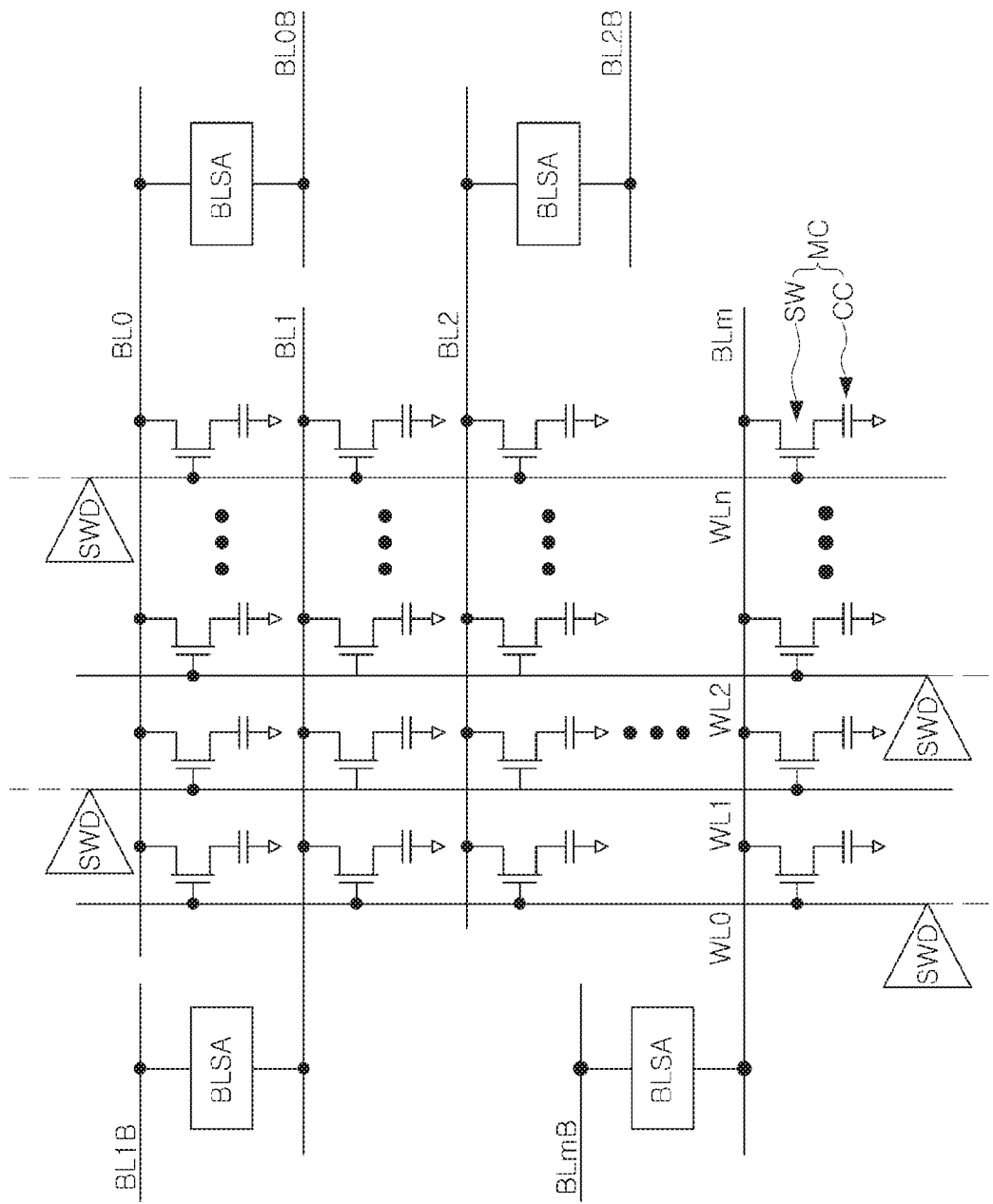

FIGS. 1 and 2 are schematic diagrams of a memory device 1 according to some example embodiments.

FIG. 1 is a schematic block diagram illustrating a structure of the memory device 1 according to some examples of embodiments. In some example embodiments, the memory device 1 of FIG. 1 may be a dynamic random-access memory (DRAM), although the present disclosure is not limited thereto. In the example embodiment illustrated in FIG. 1, the memory device 1 may include a row decoder 20, predecoders 22, connection circuits 42, wordline driving circuits 32, cell arrays 10, sense amplifier circuits 12, and driving signal generators 40 and 50. Other components may be present within the memory device 1 of FIG. 1, but discussion thereof may be omitted herein in the interest of brevity.

The row decoder 20 may decode an upper row address MRADD in response to externally received upper row addresses RA2 to RA8 (MRADD) and may select a wordline corresponding to the upper row address MRADD among wordlines WL. For example, the row decoder 20 may determine a selected wordline among the wordlines WL in response to the upper row address MRADD. As an example, the row decoder 20 may output a wordline enable signal NWEI to the wordline driving circuit 32 to enable the selected wordline.

The predecoders 22 may output predecoded signals PXI in response to lower row addresses RA0 to RA1 (LRADD). For example, the predecoders 22 may decode a lower row address LRADD among externally received row addresses and may generate predecoded signals PXI corresponding to a selected wordline. The predecoded signals PXI may be input to driving signal generators 40 and 50 included in the connection circuits 42.

The driving signal generators 40 and 50 may generate driving signals PXID and PXIB for driving wordlines WL in response to the predecoded signals PXI. For example, the driving signal generators 40 and 50 may include a pull-up circuit which may increase the driving signals PXID and PXIB to a predetermined voltage level. The driving signals PXID and PXIB may be output to sub-wordline decoders SWD included in a wordline driving circuit 32.

A first sub-wordline decoder SWD may activate and precharge a selected wordline respectively connected to the first sub-wordline decoder SWD in response to a wordline enable signal NWEI and the driving signals PXID and PXIB. As an example, the driving signal generators 40 and 50 may increase a level of the first driving signal PXID that is input to the sub-wordline decoder SWD respectively connected to the selected wordline from a first voltage to a second voltage. A level of the driving signal PXIB may be set to the first voltage. The sub-wordline decoder SWD that receives the first driving signal PXID having the second voltage and the second driving signal PXIB having the first voltage may input the first driving signal PXID to the selected wordline.

Other sub-wordline decoders SWD, which are connected to unselected wordlines that are not selected and/or indicated by the wordline enable signal NWEI, may input a predetermined power supply voltage to the unselected wordlines. In some example embodiments, the power supply voltage input to the unselected wordlines may be lower than the second voltage. As an example, the power supply voltage may be a negative constant voltage lower than 0V (Volts).

In some example embodiments, the sub-wordline decoders SWD connected to the unselected wordlines may be separated from the power supply voltage while the first sub-wordline decoder SWD connected to the selected wordline inputs the first driving signal PXID to the selected wordline. Accordingly, the sub-wordline decoder SWD that are connected to the unselected wordlines, and the unselected wordlines may be floated.

The present disclosure recognizes that in some instances, the voltage on an unselected wordline may not be maintained. As an example, when a bridge failure is present between a selected wordline and an unselected wordline that is floated, a voltage on the floated unselected wordline may not be maintained at a level of the power supply voltage and may be changed by the first driving signal PXID that is input to the selected wordline. As another example, due to a failure present in a sub-wordline decoder SWD connected to an unselected wordline, a voltage on the unselected wordline may not be maintained at a level of the power supply voltage and may be changed.

In some example embodiments, data of memory cells MC connected to an unselected wordline and/or to unselected wordlines may be detected to detect failures which may be present in the memory device 1. If the voltage on the unselected wordline is not maintained at a level of the power supply voltage and is changed, the data of the memory cells MC connected to the unselected wordline may be affected. Accordingly, the data of the memory cells MC connected to the unselected wordline or unselected wordlines may be used to detect a failure present in the memory device 1.

The data of the memory cells MC may be detected by sense amplifiers SA included in the sense amplifier circuits 12. The sense amplifiers SA may be connected to at least one of the memory cells MC through a bitline pair BL/BLB, and the sense amplifiers SA may read the data of at least one of the memory cells MC in response to an externally received column address.

In the cell arrays 10, the memory cells MC may be connected to wordlines WL and bitlines BL. Each of the memory cells MC may include a storage capacitor and a switch element. The memory cells MC are described in further detail with reference to FIG. 2.

Referring to FIG. 2, each of the memory cells MC may include a storage capacitor CC and a switch element SW. The switch element SW may have a control terminal, connected to the wordlines WL0 to WLn, and an input terminal connected to bitlines BL0 to BLm and BL0B to BLmB. The wordlines WL0 to WLn may be connected to sub-wordline decoders SWD, and the bitlines BL0-BLm and BL0B-BLmB may be connected to sense amplifiers BLSA.

Figure 3:
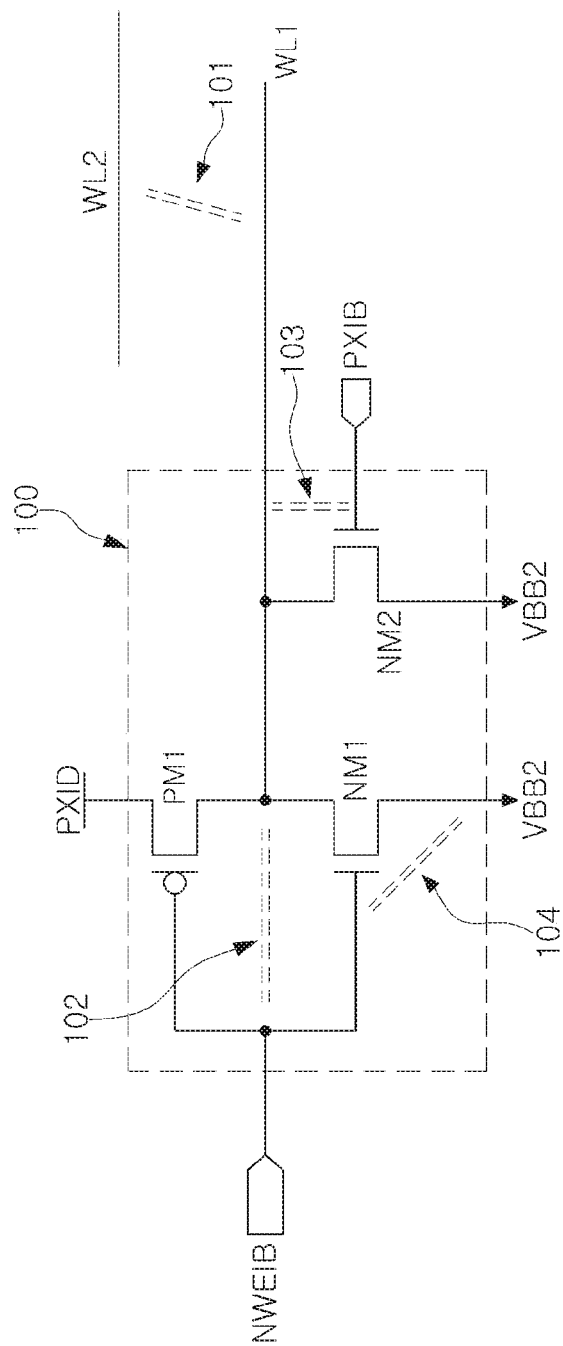
FIG. 3 illustrates a failure of a memory device according to some example embodiments.

FIG. 3 is a circuit diagram of a sub-wordline decoder 100 included in a memory device according to some example embodiments. Aspects of FIG. 3 illustrate a failure of the memory device according to some example embodiments. Referring to FIG. 3, the sub-wordline decoder 100 may include switch elements PM1, NM1, and NM2. As an example, the sub-wordline decoder 100 may include a first switch element PM1 and a second switch element NM1 connected to each other in series and turned on and off by a wordline control signal NWEIB.

The first switch element PM1 may be a PMOS transistor, and the second switch element NM1 may be an NMOS transistor. In some example embodiments, a first driving signal PXID may be input to an input terminal of the first switch element PM1, and a power supply voltage VBB2 may be input to an input terminal of the second switch element NM1. The first driving signal PXID may have different levels depending on whether a first wordline WL1 that is connected to the sub-wordline decoder 100 is selected. The power supply voltage VBB2 may be a constant voltage. In an example embodiment, the power supply voltage VBB2 may be a negative constant voltage lower than 0V.

The sub-wordline decoder 100 may include a third switch element NM2. The third switch element NM2 may be turned on and off by a second driving signal PXIB and may receive the power supply voltage VBB2.

Referring to FIG. 3, failures 101 to 104 may occur in various locations including a location between wordlines WL1 and WL2 and the inside of the sub-wordline decoder 100. For example, a first failure 101 may occur between the wordlines WL1 and WL2. The wordlines WL1 and WL2 may extend in a predetermined direction, and an insulating material may be between the wordlines WL1 and WL2. Although a distance between the wordlines WL1 and WL2 is ideally constant, the first failure 101 may occur when an electrical path is formed between the wordlines WL1 and WL2 due to, for example, the distance between the wordlines WL1 and WL2 being decreased in at least a region due to a processing error.

When the first failure 101 is present, a problem may occur when one of the wordlines WL1 and WL2 is selected. For example, when the first wordline WL1 is not selected and the second wordline WL2 is selected, a voltage on the second wordline WL2 may be increased from a first voltage to a second voltage by a first driving signal PXID. The power supply voltage VBB2 may be input to the first wordline WL1 by the sub-wordline decoder 100. In this case, a voltage on at least one of the first wordline WL1 and the second wordline WL2 may be unintentionally changed due to the first failure 101.

The second to fourth failures 102 to 104 may occur in the switch elements PM1, NM1, and NM2 included in the sub-wordline decoder 100. For example, the second failure 102 may be a bridge failure in which an electrical path is formed between a common node, via which a first switch element PM1 and a second switch element NM1 are connected to the first wordline WL1, and an input node to which a wordline control signal NWEIB is input. When the second failure 102 is present and the first wordline WL1 is not selected, the power supply voltage VBB2 may be input to the first wordline WL1. In this case, the wordline control signal NWEIB and the common node may affect each other due to the second failure 102, and a voltage on the first wordline WL1 may be unintentionally changed, or a malfunction may occur in the sub-wordline decoder 100.

The third failure 103 may be a bridge failure occurring in the third switch element NM2. When the third failure 103 occurs and the first wordline WL1 is not selected, a second driving signal PXIB may affect the first wordline WL1. As a result, the voltage on the first wordline WL1 may be unstable.

The fourth failure 104 may be a bridge failure occurring in the second switch element NM1. When the fourth failure 104 occurs and the first wordline WL1 is not selected, the wordline control signal NWEIB and the power supply voltage VBB2 may affect each other. Therefore, the voltage of the first wordline WL1 may be unstable, or a level of the wordline control signal NWEIB may be changed to cause a malfunction in the sub-wordline decoder 100.

Aspects of the present disclosure provide methods of detecting the failures 101 to 104, described with reference to FIG. 3, in advance. However, the failures 101 to 104 described with reference to FIG. 3 are examples, and other failures which may be detected in the memory device according to some embodiments are not necessarily limited to the failures 101-104 illustrated in FIG. 3.

Figure 4:
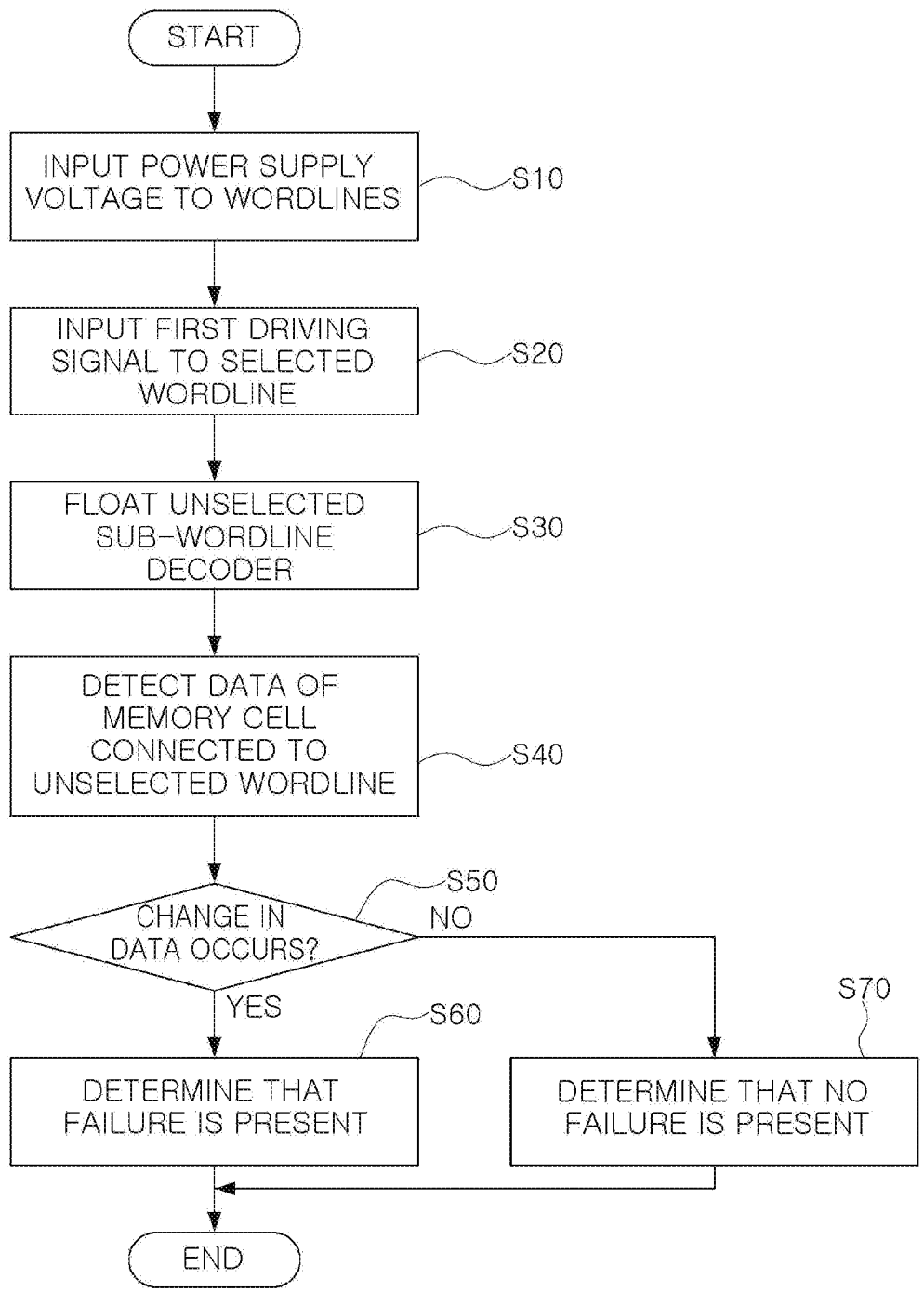
FIG. 4 is a flowchart illustrating an operation of a memory device according to some example embodiments.

FIG. 4 is a flowchart illustrating an operation of a memory device according to some example embodiments, and more specifically is a flowchart illustrating a test operation of the memory device. The test operation described with reference to FIG. 4 may be performed before and/or after packaging for the memory device. Referring to FIG. 4, an operation of the memory device according to some example embodiments may start with inputting a power supply voltage to wordlines (S10). The power supply voltage may be input by sub-wordline decoders connected to wordlines. As an example, the power supply voltage may be a negative constant voltage lower than 0V.

A row decoder included in the memory device may determine a selected wordline and one or more unselected wordlines among wordlines. When the selected wordline is determined, a sub-wordline decoder connected to the selected wordline may input a first driving signal to the selected wordline (S20). The first driving signal, input to the selected wordline, may have a level higher than 0V.

The memory device may float an unselected sub-wordline decoder connected to the one or more unselected wordlines (S30). The sub-wordline decoders may be connected a power line, providing a power supply voltage, through a predetermined power switch. The unselected sub-wordline decoder may be floated by turning off the power switch between the unselected sub-wordline decoder and the power line in the memory device.

The unselected wordline may be floated in the operation S30. Since a power line transmitting the power supply voltage is connected to the unselected wordline by the unselected sub-wordline decoder, the unselected wordline may be floated by separating the unselected sub-wordline decoder and the power line from each other.

When a bridge failure is present between the selected wordline and the unselected wordline and/or in the unselected sub-wordline decoder, a voltage on the unselected wordline may be increased by a first driving signal input to the selected wordline, a wordline control signal input to the unselected sub-wordline decoder, or the like. Thus, data of a memory cell connected to the unselected wordline may be unintentionally changed.

The memory device may detect the data of the memory cell connected to the unselected wordline (S40). As an example, the memory device may detect the data of the memory cell during a time when a wordline, determined to be an unselected wordline in S20 and S30, is determined to be a selected wordline.

The memory device may determine whether the data detected in step S40 is changed (S50). When a determination result in step S50 is that the data is changed, it may be determined that a failure is present in a wordline connected to a memory cell in which the data is changed, and/or a failure is present in a sub-wordline decoder connected to a corresponding wordline (S60). Meanwhile, when the determination result in step S50 that the data is not changed, it may be determined that no failure is present in the wordline connected to the memory cell in which the data is not changed, and/or that no failure is present in the sub-wordline decoder connected to the corresponding wordline (S70). In some example embodiments, when it is determined that a failure is present in a wordline and/or a sub-wordline decoder, the memory device may perform a repair operation to replace the wordline with a redundancy wordline.

Figure 5:
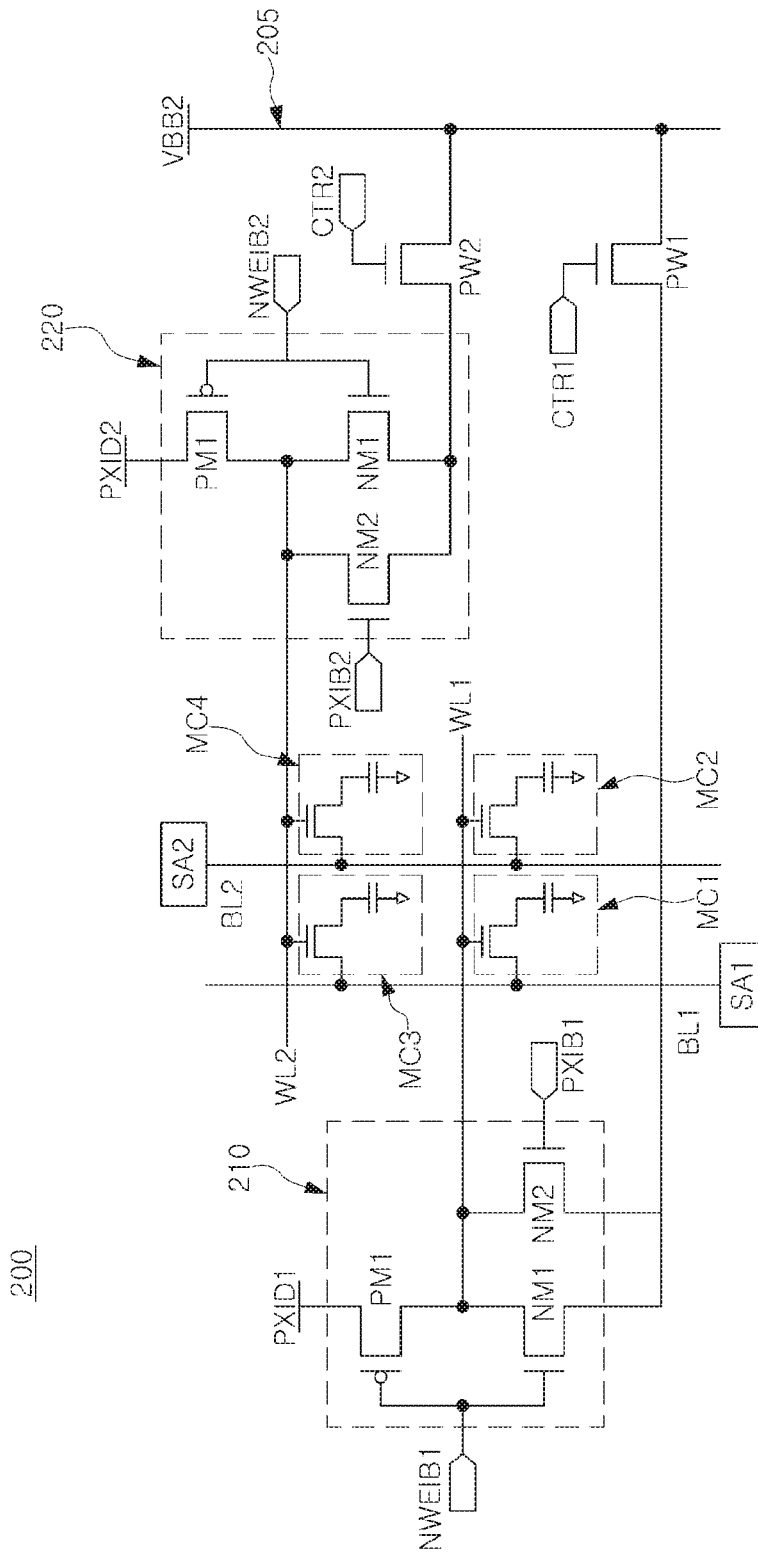
FIG. 5 illustrates an operation of a memory device according to some example embodiments.

FIG. 5 illustrates an operation of a memory device according to some example embodiments.

Referring to FIG. 5, a memory device 200 according to some example embodiments may include a first sub-wordline decoder 210 connected to a first wordline WIL1, a second sub-wordline decoder 220 connected to a second wordline WL2, a first sense amplifier SA1 connected to a first bitline BL1, and a second sense amplifier SA2 connected to a second bitline BL2. Memory cells MC1 to MC4 may be connected to the wordlines WL1 and WL2 and the bitlines BL1 and BL2.

The first sub-wordline decoder 210 and the second sub-wordline decoder 220 may have the same structure and may be understood with reference to the description associated with FIG. 3. The first sub-wordline decoder 210 may be activated or deactivated by a first wordline control signal NWEIB1, and the second sub-wordline decoder 220 may be activated or deactivated by a second wordline control signal NWEIB2. As an example, when one of the first sub-wordline decoder 210 and the second sub-wordline decoder 220 is activated, the other one of the first sub-wordline decoder 210 and the second sub-wordline decoder 220 may be deactivated and/or may not be activated.

In some example embodiments, as illustrated in FIG. 5, the memory device 200 further includes a power line 205 for supplying a power supply voltage VBB2 to the first sub-wordline decoder 210 and the second sub-wordline decoder 220. A first power switch PW1 may be connected between the first sub-wordline decoder 210 and the power line 205, and a second power switch PW2 may be connected between the second sub-wordline decoder 220 and the power line

205. The first power switch PW1 may be controlled by a first power control signal CTR1, and the second power switch PW2 may be controlled by a second power control signal CTR2.

Hereinafter, a test operation for detecting a failure, which may be present in the memory device 200, will be described with reference to FIG. 5.

When the wordlines WL1 and WL2 are not selected, the first sub-wordline decoder 210 and the second sub-wordline decoder 220 are not activated and/or may be deactivated by the first wordline control signal NWEIB1 and the second wordline control signal NWEIB2. In addition, both the first power switch PW1 and the second power switch PW2 may be turned on. The first sub-wordline decoder 210 may input the power supply voltage VBB2 to the first wordline WL1 using the first wordline control signal NWEIB1, and the second sub-wordline decoder 120 may input the power supply voltage VBB2 to the second wordline WL2 using the second wordline control signal NWEIB2.

When the first wordline WL1 is determined to be a selected wordline, the first sub-wordline decoder 210 may input a first driving signal PXID1 to the first wordline WL1 using the first wordline control signal NWEIB1. In some example embodiments, in the first sub-wordline decoder 210, a first switch element PM1 may be turned on while a second switch element NM1 and a third switch element NM2 may turned off.

In some example embodiments, levels of the first driving signal PXID1 and the second driving signal PXIB1 may be greater than or equal to a level of a first voltage and less than or equal to a level of a second voltage, and the second voltage may be greater than the first voltage. When the first wordline WL1 is selected, the level of the first driving signal PXID1 input to the first sub-wordline decoder 210 may be set to the level of the second voltage. Meanwhile, the level of the second driving signal PXIB2 may be set to the level of the first voltage to turn off the third switch element NM2. In addition, the first power switch PW1 connected to the first sub-wordline decoder 210 may be maintained in a turned-on state. However, according to some example embodiments, the first power switch PW1 may be turned off.

When the first wordline WL1 is determined to be a selected wordline, the second wordline WL2 may be determined to be an unselected wordline. Accordingly, the second sub-wordline decoder 220 may be maintained in a deactivated state by the second wordline control signal NWIEB2 and, in the second sub-wordline decoder 220, the first switch element PM1 may be turned off while the second switch element NM1 and the third switch element NM2 may be turned on.

In some example embodiments, when the first wordline WL1 is determined to be a selected wordline and the second wordline WL2 is determined to be an unselected wordline, the second power switch PW2 connected between the second sub-wordline decoder 220 and the power line 205 may be turned off. Accordingly, the power supply voltage VBB2 may not be continuously supplied to the second wordline WL2, and the second wordline WL2 may be floated. In addition, a portion of nodes included in the second sub-wordline decoder 220, for example, input terminals of the first switch element NM1 and the second switch element NM2 may be floated.

As an example, when no failure is present between the wordlines WL1 and WL2 and in the second sub-wordline decoder 220, a voltage on the second wordline WL2 may be maintained at a level of the power supply voltage VBB2, which may be input to the second wordline WL2 before the first wordline WL1 is selected. Meanwhile, when a failure is present between the wordlines WL1 and WL2 and/or in the second sub-wordline decoder 220, the voltage on the second wordline WL2 is not maintained at a level of the power supply voltage VBB2 and may be changed.

When the voltage of the second wordline WL2 is changed in the state in which the second wordline WL2 is an unselected wordline, data of the memory cells MC3 and MC4 connected to the second wordline WL2 may be changed. In some example embodiments, the second wordline WL2 may be selected and a change in the data of the memory cells MC3 and MC4 connected to the second wordline WL2 may be detected to determine whether a failure is present between the wordlines WL1 and WL2 and/or in the second sub-wordline decoder 220.

According to some example embodiments, a turned-off time of the second power switch PW2 may vary. For example, the second power switch PW2 may be maintained in a turned-off state while the first wordline WL1 is selected and the first driving signal PXID1 is input to the first wordline WL1. Alternatively, the second power switch PW2 may be turned off after a predetermined delay time has elapsed since the first driving signal PXID1 was input to the first word line WL1.

Figure 6:
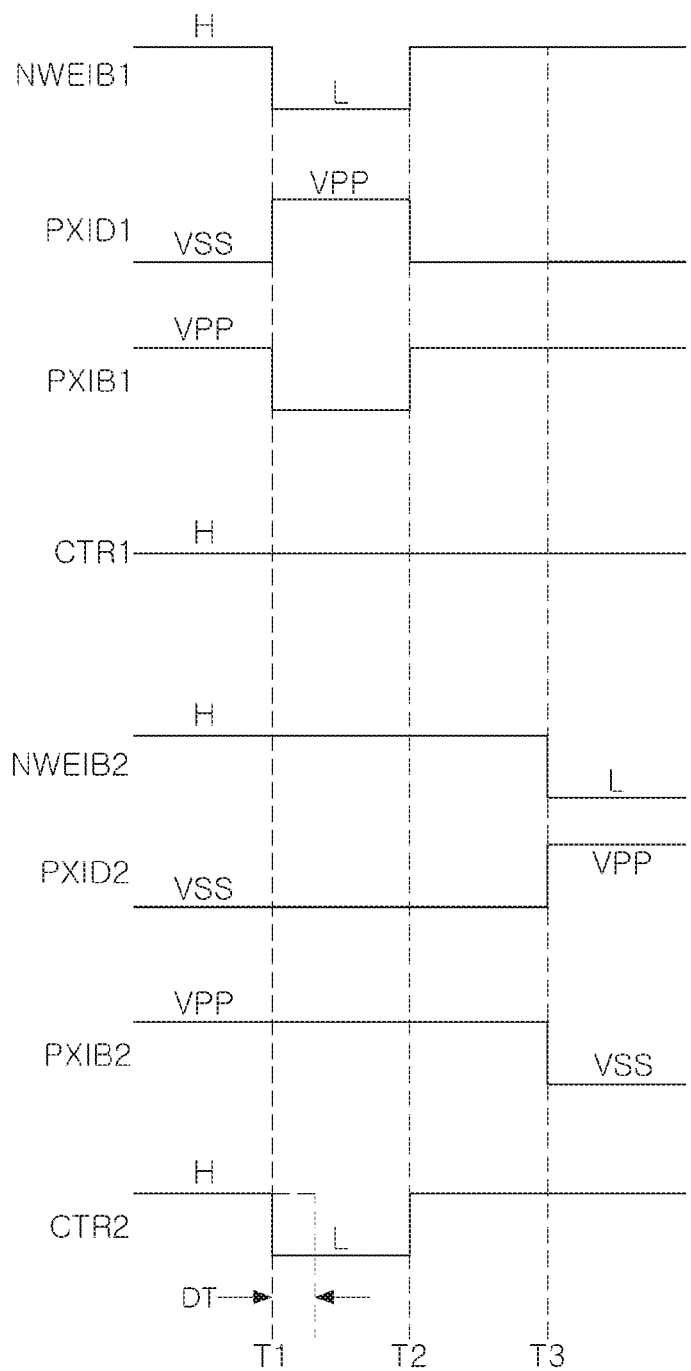
FIG. 6 illustrates an operation of a memory device according to some example embodiments.

FIG. 6 illustrates an operation of a memory device according to example embodiments. Hereinafter, for ease of description, the operation of the memory device 200 will be described with reference to FIG. 6 together with FIG. 5.

Referring to FIG. 6, during a first time prior to a first point in time T1, both a first wordline control signal NWEIB1 and the second wordline control signal NWEIB2 may be set to a high level H, and a first power supply signal CTR1 and a second power supply signal CTR2 may also be set to a high level H. Accordingly, in the first sub-wordline decoder 210, the first switch element PM1 may be turned off while the second and third switch elements NM1 and NM2 may be turned on, and the power supply voltage VBB2 may be input to the first wordline WL1. Since the second sub-wordline decoder 220 operates similarly to the first sub-wordline decoder 210, the power supply voltage VBB2 may be input to the second wordline WL2.

In some example embodiment, as illustrated in FIG. 6, during a second time between the first point in time T1 and a second point in T2, the first wordline WL1 may operate as a selected wordline and the second wordline WL2 may operate as an unselected wordline. In the first sub-wordline decoder 210, the first wordline control signal NWEIB1 may transition to a low level L, a level of the first driving signal PXID1 may be increased from a level of a first voltage VSS to a level of a second voltage VPP, and a level of the second driving signal PXIB1 may decrease from the level of the second voltage VPP to the level of the first voltage VSS. In FIG. 6, the first power switch PW1 is illustrated as being maintained in the turned-on state. However, according to some example embodiments, the first power switch PW1 may be switched to a turned-off state.

After the point in time T1, the second power switch PW2 may be turned off, and the second sub-wordline decoder 220 may be separated from the power line 205. Accordingly, the second sub-wordline decoder 220 and the second wordline WL2 may be floated. When a bridge failure is present between the first wordline WL1 and the second wordline WL2 and/or in the second sub-wordline decoder 220, a voltage on the second wordline WL may be increased from the power supply voltage VBB2 by at least one of the voltage on the first wordline WL, the second wordline control signal NWEIB2, and the second driving signal PXIB2. As the voltage on the second wordline WL is increased, data of the memory cells MC3 and MC4 connected to the second wordline may be changed.

After the second point in time T2, the voltages on the wordlines WL1 and WL2 may be restored. After a third point in time T3, the second wordline WL2 may be determined to be a selected wordline. When the second wordline WL2 is determined to be a selected wordline, in the second sub-wordline decoder 220, a level of the second wordline control signal NWEIB2 may be set to a low level L and a level of the first driving signal PXID2 may be increased from the level of the first voltage VSS to the level of the second voltage VPP, and the level of the second driving signal PXIB2 may be decreased from the level of the second voltage VPP to the level of the first voltage VSS.

After the third point in time T3, the memory device may control the sense amplifiers SA1 and SA2 to read the data of memory cells MC3 and MC4 connected to the second wordline WL2. When it is determined that the data read from the memory cells MC3 and MC4 are unintentionally changed, the memory device may determine that a bridge failure is present between the wordlines WL1 and WL2 and/or in the second sub-wordline decoder 220. In some example embodiments, the memory device may perform a repair operation to replace the second wordline WL2 with one of the redundancy wordlines.

In some example embodiments, as illustrated in FIG. 6, it is assumed that a point in time when the first driving signal PXID1 is input to the first wordline WL1 and a point in time when the second wordline WL2 is floated are the same as the first point in time T1. However, the present disclosure is not necessarily limited thereto. For example, a point in time when the second wordline WL2 is floated may precede a point in time when the first driving signal PXID1 is input to the first wordline WL1 or may lag behind the point in time when the first driving signal PXID1 is input to the first wordline WL1, by a predetermined delay time DT.

FIGS. 7 to 12 illustrate an operation of a memory device according to some example embodiments. Hereinafter, for ease of description, the operation of the memory device will be described with reference to FIGS. 7 to 12 together with FIG. 5.

Figure 7:
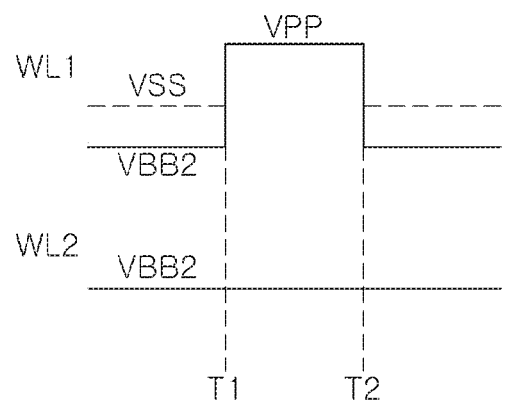
FIGS. 7 to 12 illustrate an operation of a memory device according to some example embodiments.
Figure 8:
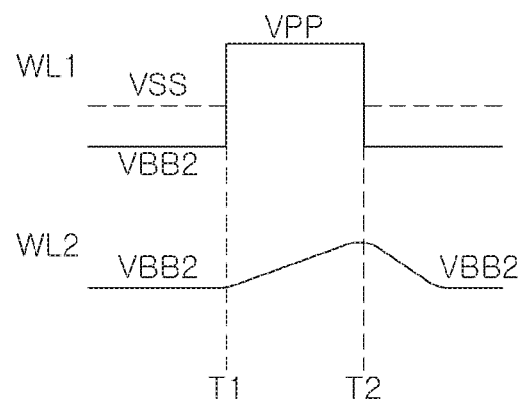

FIGS. 7 and 8 are graphs illustrating a voltage change occurring on a second wordline WL2 depending on whether a failure is present between first and second wordlines WL1 and WL2. In example embodiments illustrated in FIGS. 7 and 8, the first wordline WL1 may be a selected wordline, and the second wordline WL2 may be an unselected wordline.

The voltages on the first and second wordlines WL1 and WL2 may be initially set to a power supply voltage VBB2. The first sub-wordline decoder 210 may supply a second voltage VPP to the first (selected) wordline WL1. In some example embodiments, the second (unselected) wordline WL2 may be floated.

When a bridge failure, or the like, is not present between the first and second wordlines WL1 and WL2, the level of the second wordline WL2 may be maintained at the level of the power supply voltage VBB2, as illustrated in FIG. 7. Meanwhile, when a bridge failure is present between the first and second wordlines WL1 and WL2, a level of the second wordline WL2, floated by the second voltage VPP input to the first wordline WL1 may be increased, as illustrated in FIG. 8. When the level of the floated second wordline WL2 is increased, data of memory cells MC3 and MC4 connected to the second wordline WL2 may be changed. The memory device may detect a change in the data of the memory cells MC3 and MC4 to determine the bridge failure.

FIGS. 9 to 12 are graphs illustrating a change in the voltage on a second wordline WL2 that is an unselected wordline, depending on whether the second sub-wordline decoder 220 connected to the second wordline WL2 fails.

Figure 9:
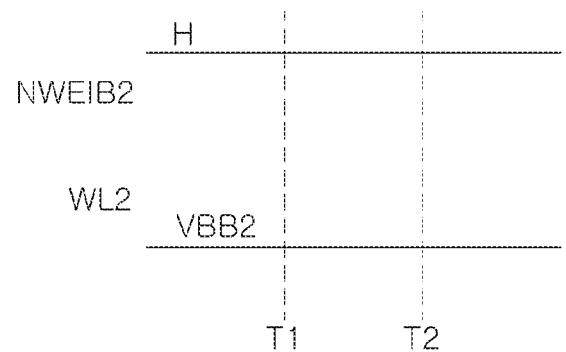
Figure 10:
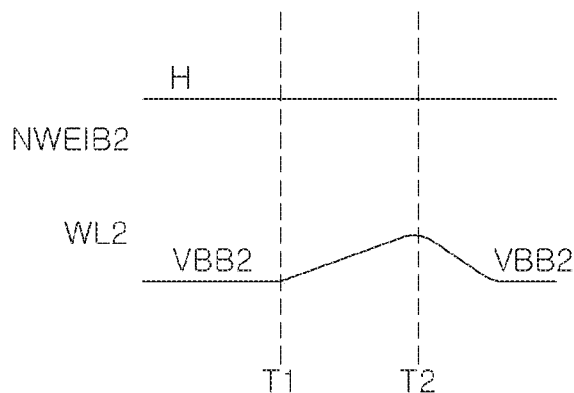

Referring first to FIGS. 9 and 10, as described above, the voltages of the wordlines WL1 and WL2 may be initially set to the power supply voltage VBB2. The second wordline control signal NWEIB2 input to the second sub-wordline decoder 220 is maintained at a high level H, so that in the second sub-wordline decoder 220, the first switch element PM1 may be turned off and the second and third switch elements NM1 and NM2 may be turned on. At a point in time between the first point in time T1 and a second point in time T2, the second power switch PW2 may be turned off by the second control signal CTR2 and the power supply voltage may not be input to the second wordline WL2.

FIG. 9 may be a case in which no failure is present in the second sub-wordline decoder 220. In this case, a level of the second wordline WL2 may be maintained at a level of the power supply voltage VBB2. On the other hand, FIG. 10 may be a case in which a failure is present in the second sub-wordline decoder 220. As an example, FIG. 10 may correspond to example embodiments in which a bridge failure is present in the second sub-wordline decoder 220. For example, a node between the first switch element PM1 and the second switch element NM1 may be electrically connected to a node receiving the second wordline control signal NWEIB2. Accordingly, the level of the second wordline WL2 may be increased by the second wordline control signal NWEIB2 having a high level H.

As an example, the level of the second wordline WL2 may be decreased to the level of power supply voltage VBB2 again as the second power switch PW2 is turned on after the second point in time T2. However, a change in the level of the second wordline WL2, occurring between the first point in time T1 and the second point in time T2, may affect the data of the memory cells MC3 and MC4. The memory device may detect the change in the data of the memory cells MC3 and MC4, connected to the second wordline WL2, to determine a failure.

Figure 11:
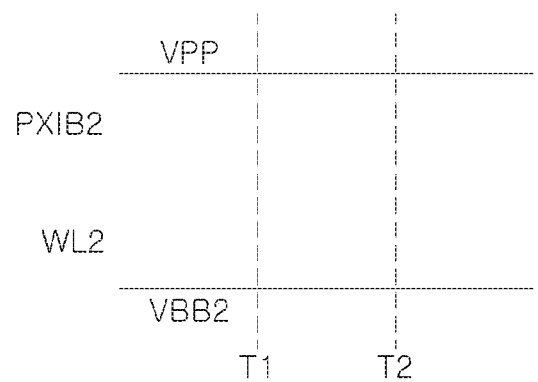
Figure 12:
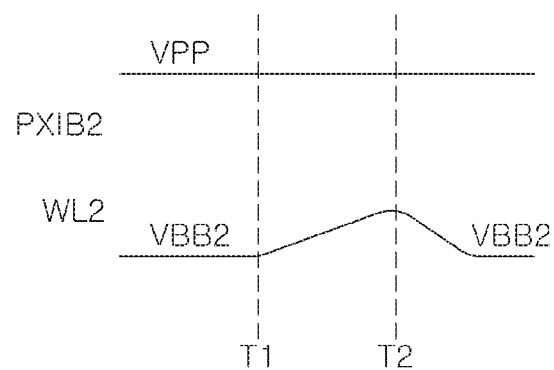

Referring to FIGS. 11 and 12, as described above, the voltages on the wordlines WL1 and WL2 may be initially set to the power supply voltage VBB2. In the second sub-wordline decoder 220, the second driving signal PXIB2 input to the third switch element NM2 may be maintained at a high level H. Accordingly, the third switch element NM2 may be turned on to input the power supply voltage VBB2 to the second wordline WL2. When the second power switch PW2 is turned off by the second control signal CTR2 at the first time point T1, the power supply voltage VBB2 may not be input to the second wordline WL2, irrespective of whether the third switch element NM2 is turned on.

FIG. 11 may be a case in which no failure is present in the second sub-wordline decoder 220. In this case, a level of the second wordline WL2 may be maintained at a level of the power supply voltage VBB2 even after a first point in time T1. Meanwhile, FIG. 12 may be a case in which a failure is present in the second sub-wordline decoder 220. As an example, FIG. 12 may correspond to example embodiments in which a bridge failure is present between a control terminal and an output terminal of the third switch element NM2. The second driving signal PXIB2 may be input to a control terminal of the third switch element NM2, and the second wordline WL2 may be connected to an output terminal of the third switch element NM2. Accordingly, when a bridge failure is present, a level of the second wordline WL2 may be increased by the second driving signal PXIB2 having a high level H.

Figure 13:
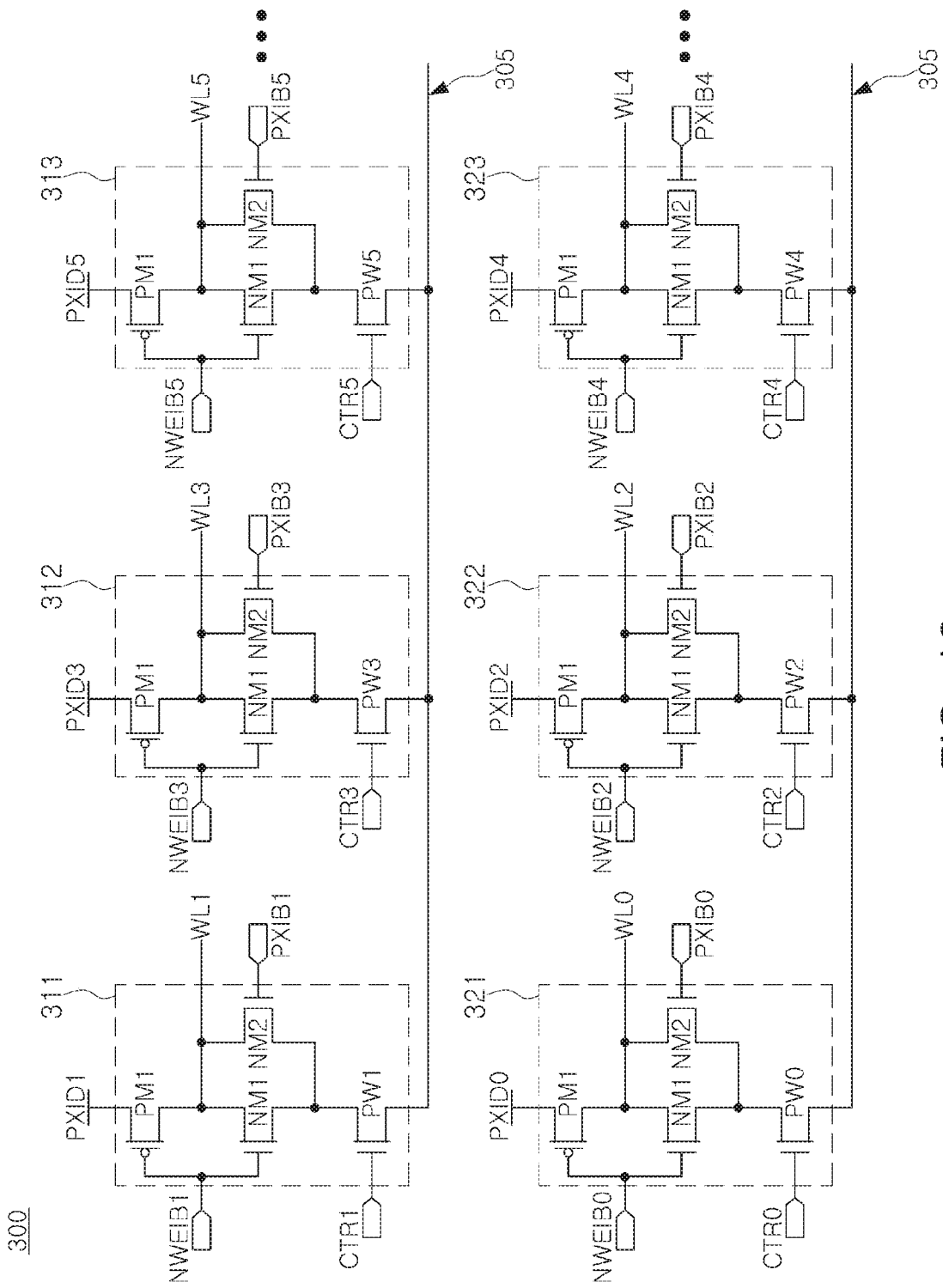
FIGS. 13 to 15 are schematic circuit diagrams of memory devices according to some example embodiments.
Figure 14:
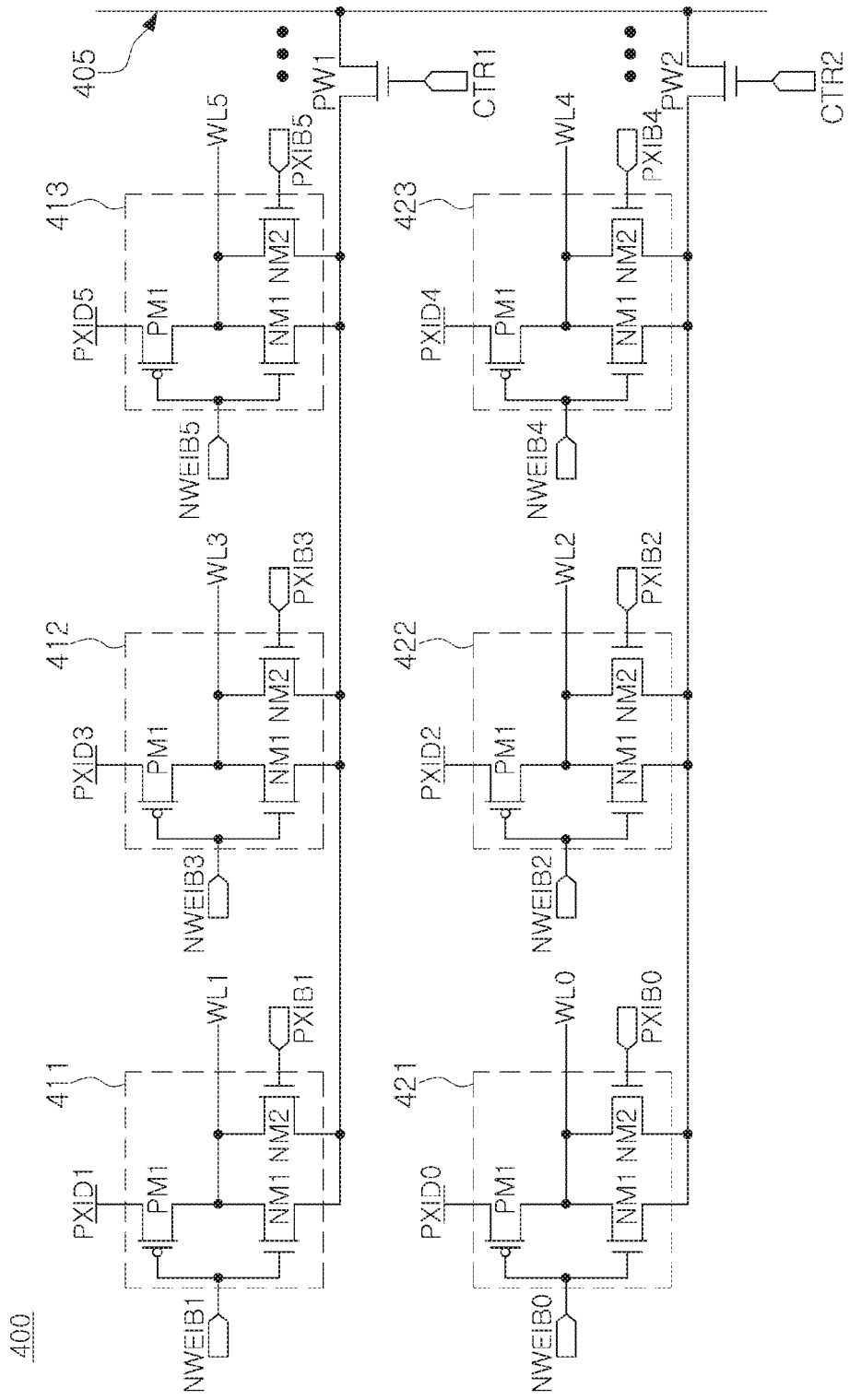
Figure 15:
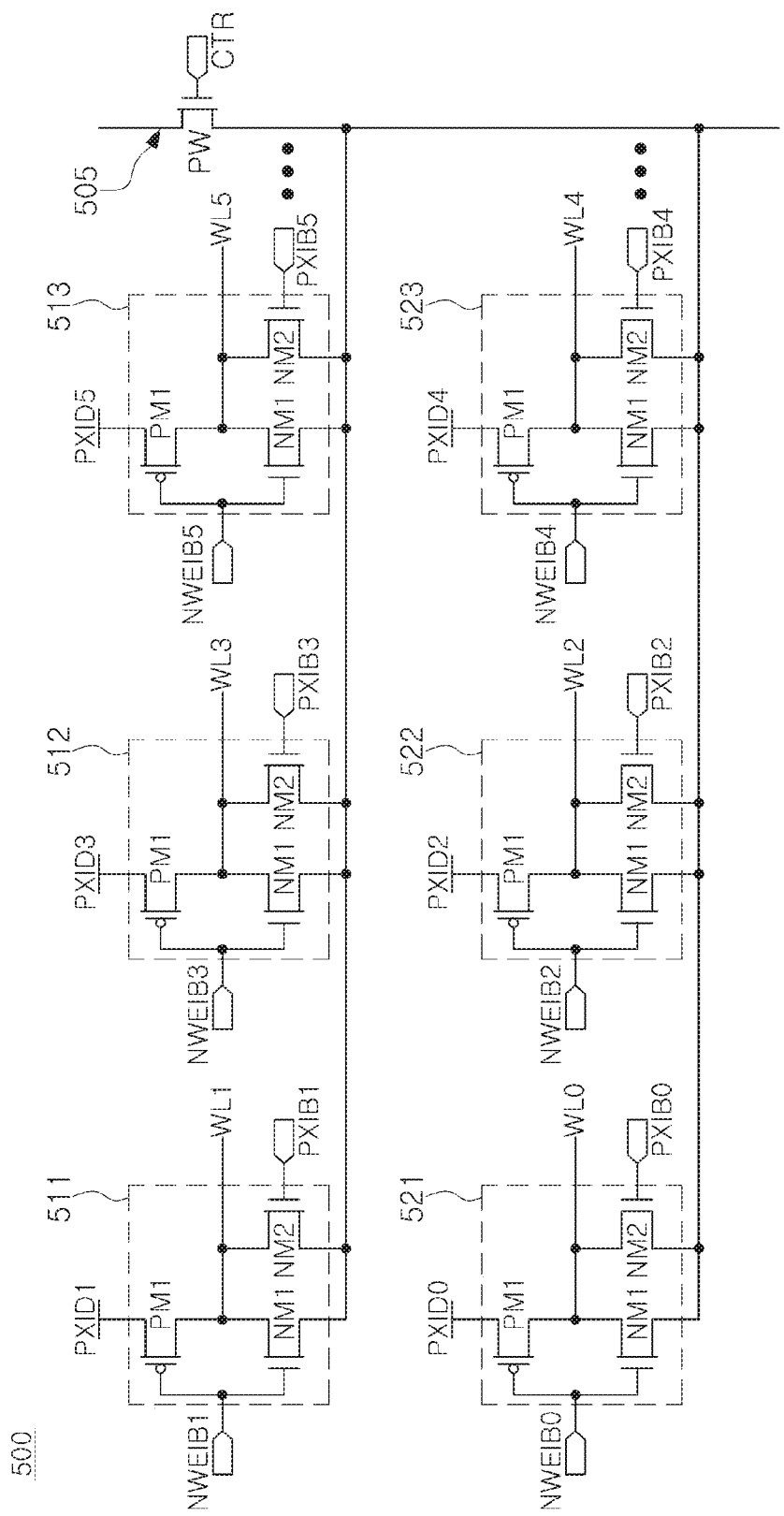

FIGS. 13 to 15 are schematic circuit diagrams of memory device according to some example embodiments.

Referring first to FIG. 13, a memory device 300 according to some example embodiments may include sub-wordline decoders 311 to 313 and 321 to 323 connected to wordlines WL0 to WL5. The wordlines WL0 to WL5 and the sub-wordline decoders 311 to 313 and 321 to 323 may vary in number.

The wordlines WL0 to WL5 may include odd wordlines WL1, WL3, and WL5 and even wordlines WL0, WL2, and WL4. The sub-wordline decoders 311 to 313 and 321 to 323 may include odd sub-wordline decoders 311 to 313 and even sub-wordline decoders 321 to 323. Each of the sub-wordline decoders 311 to 313 and 321 to 323 may be connected to a power line 305 for supplying a predetermined power supply voltage. The power supply voltage may be a negative constant voltage lower than 0V.

In some example embodiments, as illustrated in FIG. 13, power switches PW0 to PW5, connecting the sub-wordline decoders 311 to 313 and 321 to 323 to the power line 305, may be included in sub-wordline decoders 311 to 313 and 321 to 323, respectively. As an example, when the first even sub-wordline decoder 321 is activated to input the first driving signal PXID1 to the first even wordline WL0, power switches PW1 to PW5 included in the other sub-wordline decoders 311 to 313 and 322 to 323 may be turned off to float the other wordlines WL1 to WL5.

However, the above is merely an example, and only a portion of the power switches PW0 to PW5 included in the sub-wordline decoders 311 to 313 and 321 to 323 may be turned off. As an example, among the power switches PW0 to PW5, a power switch to be turned off may vary depending on unselected wordlines adjacent to selected wordline. For example, even wordlines WL0, WL2, WL4 and odd wordlines WL1, WL3, and WL5 may be alternately arranged. When a first even wordline WL0 is selected, only a first power switch PW1, connected to the first odd wordline WL1 adjacent to the first even wordline WL, may be selectively turned off.

Referring to FIG. 14, a memory device 400 according to some example embodiments may include sub-wordline decoders 411 to 413 and 421 to 423 connected to the wordlines WL0 to WL5. The wordlines WL0 to WL5 may include odd wordlines WL1, WL3, and WL5 and even wordlines WL0, WL2, and WL4, and sub-wordline decoders 411 to 413 and 421 to 423 may include odd sub-wordline decoders 411 to 413 and even sub-wordline decoders 421 to 423.

Each of the sub-wordline decoders 411 to 413 and 421 to 423 may be connected to a power line 405 for supplying a predetermined power supply voltage. In some example embodiments, as illustrated in FIG. 14, the first power switch PW1 may be commonly connected to the odd sub-wordline decoders 411 to 413, and the second power switch PW2 may be commonly connected to the even sub-wordline decoders 421 to 423.

As an example, when a first odd sub-wordline decoder 411 is activated, a first power switch PW1 may be maintained in a turned-on state and the second power switch PW2 may be turned off. Accordingly, the even wordlines WL0, WL2, and WL4 may be separate from the power line 405 in order to be floated, and a bridge failure between the first odd wordline WL1 and the other even wordlines WL0, WL2, and WL4 adjacent to the first odd wordline WL may be determined. In addition, a failure of each of the even sub-wordline decoders 421 to 423 may also be determined.

According to some example embodiments, the first power switch PW1 may also be turned off while the first odd sub-wordline decoder 411 is activated. As the first power switch PW1 is turned off, failures of the other odd sub-wordline decoders 412-413, which are not activated, may be determined.

In some example embodiments, as illustrated in FIG. 14, since a plurality of sub-wordline decoders 411 to 413 and 421 to 423 are respectively connected to the power switches PW1 and PW2, the number of the power switches PW1 and PW2 may be decreased as compared with the example illustrated in FIG. 13. In the example illustrated in FIG. 14, the power switches PW1 and PW2 may be disposed in connection circuits outputting driving signals PXID0 to PXID5 and PXIB0 to PXIB5.

Referring to FIG. 15, a memory device 500 according to some example embodiments may include sub-wordline decoders 511 to 513 and 521 to 523 connected to the wordlines WL0 to WL5. The wordlines WL0 to WL5 may include odd wordlines WL1, WL3, and WL5 and even wordlines WL0, WL2, and WL4, and sub-wordline decoders 511 to 513 and 521 to 523 may include odd sub-wordline decoders 511 to 513 and even sub-wordline decoders 521 to 523.

Each of the sub-wordline decoders 511 to 513 and 521 to 523 may be connected to a power line 505 for supplying a predetermined power supply voltage. In the example illustrated in FIG. 15, a single power switch PW may be connected between the sub-wordline decoders 511 to 513 and 521 to 523 and the power line 505. For example, the power switch PW may be disposed in a row decoder of the memory device 500.

As an example, when the second odd sub-wordline decoder 512 is activated, the power switch PW may be turned off. A first driving signal PXID3 may be input to the second odd wordline WL3 by the second odd sub-wordline decoder 512. The other sub-wordline decoders 511, 513, and 521 to 523 may all be separated from the power line 405, and the other wordlines WL0 to WL2 and WL4 and WL5. Accordingly, a bridge failure between the second odd wordline WL3 and the other wordlines WL0 to WL2 and WL4 to WL5, and/or a failure of each of deactivated sub-wordline decoders 511, 513, and 521 to 523 may be determined.

Figure 16:
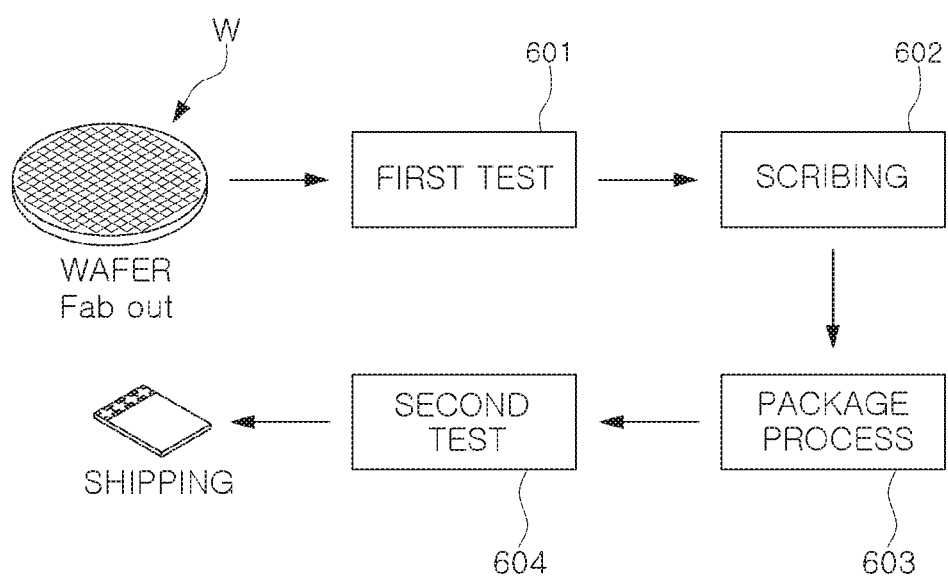
FIG. 16 illustrates a fabrication process of a memory device according to some example embodiments.

FIG. 16 illustrates a fabrication process of a memory device according to some example embodiments.

Referring to FIG. 16, a plurality of semiconductor dies may be produced by applying semiconductor processes to a wafer W, and the wafer W may be fabricated out. In some example embodiments, the plurality of semiconductor dies, included in the wafer W, may be memory devices according to the example embodiments described with reference to FIGS. 1 to 15. When the wafer W is fabricated out, a first test 601 may be performed to select one wordline among wordlines included in the memory device and to float unselected wordlines. For example, the first test 601 may be performed at a wafer level and wordlines, determined to fail by the first test 601, may be replaced with redundancy wordlines.

When the first test 601 is completed, a scribing process 602 and a package process 603 may be performed to separate semiconductor dies. When the package process 603 is completed, a second test 604 may be performed. The second test 604 may be performed at the package level, and may include operations similar to operation of the first test 601. As an example, in the second test 604, a change in data may be determined by selecting a selected wordline and an unselected wordline among the wordlines, floating the unselected wordline while inputting a driving signal to the selected wordline, and reading data of memory cells connected to the unselected wordline. When a change in data is detected in the memory cells connected to the unselected wordline, it may be determined that a failure is present in a sub-wordline decoder, connected to the unselected wordline and/or the unselected wordline, or the like, and a repair operation may be performed.

According to some example embodiments, one of the first and second tests 601 and 604 may be omitted. For example, a test operation according to an example embodiment may be performed at only one of a wafer level and a package level. Alternatively, a test operation according to an example embodiment may be performed while a memory device is mounted in an electronic device and operates after shipping the memory device. As an example, the memory device may perform a test operation according to an example embodiment for each predetermined period while operating in combination with an electronic device, and may perform a repair operation when a failure is determined to occur.

Figure 17:
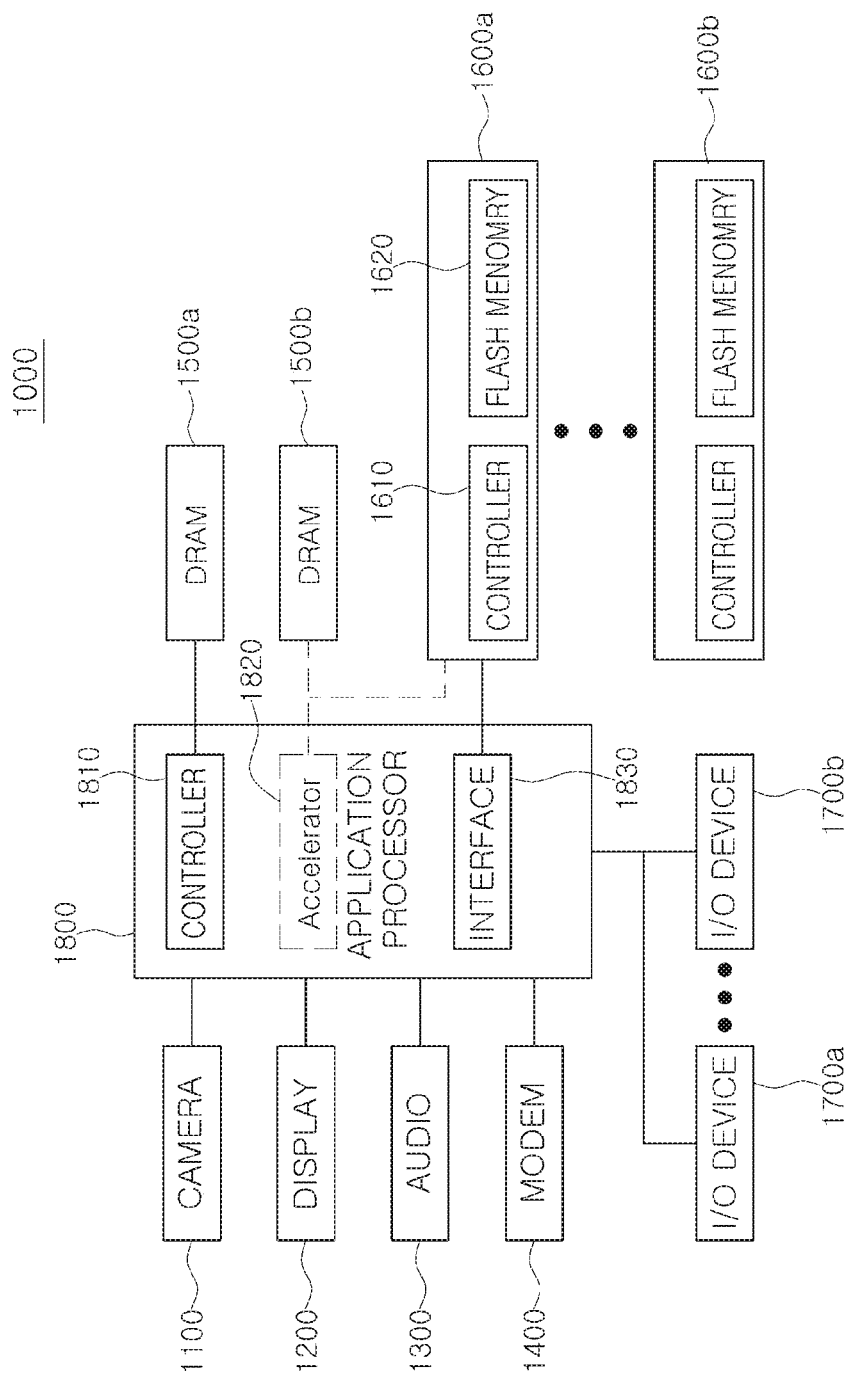
FIG. 17 is a schematic block diagram of a mobile system including a memory device according to some example embodiments.

FIG. 17 is a schematic block diagram of a mobile system including a memory device according to some example embodiments.

Referring to FIG. 17, a mobile system 1000 may include a camera 1100, a display 1200, an audio processor 1300, a modem 1400, DRAMs 1500a and 1500b, and flash memory devices 1600a and 1600b, input/output (I/O) devices 1700a and 1700b, and an application processor (hereinafter referred to as "AP") 1800.

The mobile system 1000 may be implemented as a laptop computer, a portable terminal, a smartphone, a tablet personal computer (table PC), a wearable device, a healthcare device, or an Internet-of-Things (IoT) device. Also, the mobile system 1000 may be implemented as a server or a PC.

The camera 1100 may capture a still image or a video under the user's control. The mobile system 1000 may obtain specific information using a still image/video captured by the camera 1100, or may convert and store the still image/video into other types of data such as text. Alternatively, the mobile system 1000 may recognize a character string included in the still image/video captured by the camera 1100, and may provide a text or audio translation corresponding to the character string. As described above, the camera 1100 in the mobile system 1000 may be used in various fields of application. In some example embodiments, the camera 1100 may transmit data, such as a still image/video, to the AP 1800 according to a D-PHY or C-PHY interface in the MIPI standard.

The display 1200 may be implemented in various forms such as a liquid crystal display (LCD), an organic light emitting diodes (OLED) display, an active-matrix organic light emitting diodes (AMOLED) display, a plasma display panel (PDP), a field emission display (FED), an electronic paper, and the like. In some example embodiments, the display 1200 may provide a touchscreen function to be also used as an input device of the mobile system 1000. In addition, the display 1200 may be integrated with a fingerprint sensor, or the like, to provide a security function of the mobile system 1000. In some example embodiments, the AP 1800 may transmit image data, to be displayed on the display 1200 according to the D-PHY or C-PHY interface in the MIPI standard, to the display 1200.

The audio processing unit 1300 may process audio data, stored in flash memory devices 1600a and 1600b, or audio data included in contents externally received through a modem 1400 or the I/O devices 1700a and 1700b. For example, the audio processing unit 1300 may perform various processes such as coding/decoding, amplification, and noise filtering, or the like, on the audio data.

The modem 1400 may modulate a signal and transmit the modulated signal to transmit and receive wired/wireless data, and may demodulate an externally received signal to restore an original signal. The I/O devices 1700a and 1700b may provide digital input and output, and may include an input device, such as a port connectable to an external recording medium, a touchscreen, or a mechanical button key, and an output device, capable of outputting a vibration in a haptic manner. In certain examples, the I/O devices 1700a and 1700b may be connected to an external recording medium through a port such as a USB, a lightning cable, an SD card, a micro SD card, a DVD, a network adapter, or the like.

The AP 1800 may control the overall operation of the mobile system 1000. Specifically, the AP 1800 may control the display 1200 to display a portion of the contents, stored in the flash memory devices 1600a and 1600b, on a screen. When a user input is received through the I/O devices 1700a and 1700b, the AP 1800 may perform a control operation corresponding to the user input.

The AP 1800 may be provided as a system-on-chip (SoC) driving an application program, an operating system (OS), or the like. In addition, the AP 1800 may be included in a single semiconductor package together with other devices included in the mobile system 1000, for example, a DRAM 1500a, a flash memory 1620, and/or a memory controller 1610. For example, the AP 1800 and at least one device may be provided in a package form such as Package on Package (PoP), Ball grid arrays (BGAs), Chip scale packages (CSPs), System In Package (SIP), Multi Chip Package (MCP), Wafer-level Fabricated Package (WFP), Wafer-In the form of a package such as a Level Processed Stack Package (WSP). A kernel of the operating system, driven on the AP 1800, may include an input/output scheduler and a device driver for controlling the flash memory devices 1600a and 1600b. The device driver may control access performance of the flash memory devices 1600a and 1600b with reference to the number of synchronous queues managed by the input/output scheduler, or may control a CPU mode inside the SoC, a dynamic voltage and frequency scaling (DVFS) level, and the like.

In some example embodiments, the AP 1800 may include a processor block, executing an operation or driving an application program and/or an operating system, and various other peripheral elements connected through a system block and a system bus. The peripheral elements may include a memory controller, an internal memory, a power management block, an error detection block, a monitoring block, and the like. The processor block may include one or more cores. When a plurality of cores are included in the processor block, each of the cores includes a cache memory and a common cache, shared by the cores, may be included in the processor block.

In some embodiments, the AP 1800 may include an accelerator block 1820, a specific-purpose circuit for AI data operation. Alternatively, according to some example embodiments, a separate accelerator chip may be provided to be separated from the AP 1800, and a DRAM 1500b may be additionally connected to the accelerator block 1820 or an accelerator chip. The accelerator block 1820 may be a functional block specialized in performing specific functions of the AP 1800, and may include a graphics processing unit (GPU) serving as a functional block specialized in processing graphics data, a neural processing unit (NPU) serving as a functional block specialized in performing AI computation and interference, a data processing unit (DPU) serving as a functional block specialized in transmitting data, or the like.

According to an example embodiment, the mobile system 1000 may include a plurality of DRAMs 1500a and 1500b. In an example embodiment, the AP 1800 may include a controller 1810 for controlling the DRAM 1500a and 1500b, and the DRAM 1500a may be directly connected to the AP 1800.

The AP 1800 may set a command and a mode register set (MRS) command according to the JEDEC standard to control a DRAM, or may set specifications and functions required by the mobile system 1000, such as a low voltage, high speed, and reliability, and a DRAM interface protocol for CRC/ECC to perform communication. For example, the AP 1800 may set a new DRAM interface protocol to control the DRAM 1500b for an accelerator, in which an accelerator block 1820 or an accelerator chip provided independently of the AP 1800 has a higher bandwidth than the DRAM 1500a, to perform communication.

Only the DRAMs 1500a and 1500b are illustrated in FIG. 17, but a configuration of the mobile system 1000 is not necessarily limited thereto. According to bandwidth and reaction speed of the AP 1800 and the accelerator block 1820 and voltage conditions, memories other than the DRAMS 1500a and 25000b may be included in the mobile system 1000. As an example, the controller 1810 and/or the accelerator block 1820 may control various memories such as PRAM, SRAM, MRAM, RRAM, FRAM, Hybrid RAM, and the like. The DRAMs 1500a and 1500b have relatively lower latency and higher bandwidth than input/output devices 1700a and 1700b or flash memory devices 1600a and 1600b. The DRAMs 1500a and 1500b may be initialized at a power-on point in time of the mobile system 1000. When an operating system and application data are loaded, the DRAMs 1500a and 1500b may be used as locations, in which the operating system and application data are temporarily stored, or as spaces in which various software codes are executed.

Four fundamental arithmetic operations such as addition, subtraction, multiplication, and division and a vector operation, an address operation, or FFT operation data may be stored in the DRAMs 1500a and 1500b. In some example embodiments, the DRAMs 1500a and 1500b may be provided as a processing in memory (PIM) having an operational function. For example, a function used to perform inference in the DRAMs 1500a and 1500b may be performed. In this case, the inference may be performed in a deep learning algorithm using an artificial neural network. The deep learning algorithm may include a training step, in which a model is learned through various data, and an inference step in which data is recognized with the trained model. For example, a function used in the inference may include a hyperbolic tangent function, a sigmoid function, a rectified linear unit (ReLU) function, or the like.

In the example illustrated in FIG. 17, each of the DRAMs 1500a and 1500b may be a memory device according to the example embodiments described with reference to FIGS. 1 to 16. Before and/or after the DRAMs 1500a and 1500b are mounted on the mobile system 1000, they may perform a test operation to determine a bridge failure in wordlines and/or sub-wordline decoders connected to the wordlines.

As an example, the DRAMs 1500a and 1500b may float an unselected wordline while a predetermined driving signal is input to a selected wordline. When a failure is present in the unselected wordline and/or the unselected sub-wordline decoder connected to the unselected wordline, a voltage on the unselected wordline may be changed and data of memory cells connected to the unselected wordline may also be changed. A memory device may detect a change in data of the memory cells, connected to the unselected wordline, to determine whether a failure is present and may perform a repair operation.

As an example, an image captured by a user through the camera 1100 may be signal-processed and stored in the DRAM 1500b, and the accelerator block 1820 or the accelerator chip may an AI data operation using the data stored in the DRAM 1500b and the function used in the inference to recognize data.

According to some example embodiments, the mobile system 1000 may include a plurality of storage or a plurality of flash memory devices 1600a and 1600b having capacity higher than capacity of the DRAMs 1500a and 1500b. The flash memory devices 1600a and 1600b may include a controller 1610 and a flash memory 1620. The controller 1610 may receive a control command and data from the AP 1800, and may write data to the flash memory 1620 in response to the control command or may read data stored in the flash memory 1620 and transmit the read data to the AP 1800.

According to some example embodiments, the accelerator block 1820 or the accelerator chip may perform a training step and an AI data operation using the flash memory devices 1600a and 1600b. In some example embodiments, an operational logic, capable of performing a predetermined operation in the flash memory devices 1600a and 1600b, may be implemented in the controller 1610. Instead of the AP 1800 and/or the accelerator block 1820, the operational logic may perform at least a portion of the training step and the inference, performed by the AP 1800 and/or the accelerator block 1820, using the data stored in the flash memory 1620.

In some example embodiments, the AP 1800 may include an interface 1830. Accordingly, the flash memory devices 1600a and 1600b may be directly connected to the AP 1800. For example, the AP 1800 may be implemented as an SoC, the flash memory device 1600a may be implemented as a chip independently of the AP 1800, and the AP 1800 and the flash memory device 1600a may be mounted in a single package. However, example embodiments are not limited thereto, and the plurality of flash memory devices 1600a and 1600b may be electrically connected to the mobile system 1000 through a connection.

The flash memory devices 1600a and 1600b may store data such as a still image/video, captured by the camera 1100, and/or data received through a communications network and/or ports included in the input and output devices 1700a and 1700b. For example, the flash memory devices 1600a and 1600b may store augmented reality/virtual reality, high definition (HD) or ultra high definition (UHD) content.

As described above, a failure present in a memory device may be determined by separating sub-wordline decoders connected to unselected wordlines from a power supply voltage to be floated and detecting data of unselected memory cells connected to the unselected wordlines. According to example embodiments, a potential failure present in the memory device may be preemptively determined to improve the quality of the memory device.

While example embodiments have been shown and described above, it will be apparent to those skilled in the art that modifications and variations could be made without departing from the scope of the present inventive concepts as defined by the appended claims.

What is claimed is:

1. A memory device comprising:
a memory cell array including a plurality of memory cells connected to a plurality of wordlines and a plurality of bitlines;
a wordline driving circuit including a plurality of sub-wordline decoders connected respectively to the plurality of wordlines, wherein each sub-wordline decoder is configured to input a first driving signal to the respectively connected wordline when the wordline is selected, and wherein each sub-wordline decoder is configured to input a predetermined power supply voltage to the respectively connected wordline when the wordline is unselected;
a sense amplifier circuit including sense amplifiers connected to the bitlines; and
a logic circuit configured to determine a failure of at least one of the memory cell array and the wordline driving circuit by floating unselected sub-wordline decoders while the first driving signal is input to a selected wordline, and detecting data of memory cells connected to unselected wordlines using at least one of the sense amplifiers,
wherein the first driving signal has a level greater than or equal to a level of a first voltage, and less than or equal to a level of a second voltage,
wherein the level of the second voltage is higher than the level of the first voltage, and
wherein the first driving signal that is input to the selected wordline has the same level as the second voltage.

2. The memory device of claim 1, wherein the failure is a bridge failure between the selected wordline and a first unselected wordline, and wherein the logic circuit determines the bridge failure by detecting data of first unselected memory cells connected to the first unselected wordline adjacent to the selected wordline.

3. The memory device of claim 1, wherein each of the sub-wordline decoders includes a first switch element configured to receive the first driving signal, and a second switch element and a third switch element each configured to receive the power supply voltage, and
wherein the first switch element and the second switch element are commonly controlled by a wordline enable signal and the third switch element is controlled by a second driving signal different from the first driving signal.

4. The memory device of claim 3, wherein the logic circuit is configured to float the second switch element and the third switch element while the first driving signal is input to the selected wordline by blocking the second switch element and the third switch element of the unselected sub-wordline decoders from the power supply voltage.

5. The memory device of claim 4, wherein the logic circuit is configured to determine that a bridge failure occurs in at least one of the first to third switch elements when a change in data is detected in at least one unselected memory cell.

6. The memory device of claim 1, wherein the power supply voltage is a negative constant voltage.

7. The memory device of claim 1, wherein the second voltage is greater than the power supply voltage.

8. A memory device comprising:
a memory cell array including a plurality of memory cells connected to a plurality of wordlines and a plurality of bitlines;
a wordline driving circuit including sub-wordline decoders connected to the wordlines, wherein each of the sub-wordline decoders is connected to a power line and is configured to output a predetermined power supply voltage through a power switch; and
a logic circuit configured to control the power switch,
wherein the sub-wordline decoders are configured to connect to the power line during a first time and input the power supply voltage to the wordlines, and
wherein a selected sub-wordline decoder connected to a selected wordline is configured to input a driving voltage higher than the power supply voltage to the selected wordline during a second time subsequent to the first time, and
wherein unselected sub-wordline decoders connected to unselected wordlines are configured to separate from the power line during the second time to be floated.

9. The memory device of claim 8, wherein each of the sub-wordline decoders includes the power switch.

10. The memory device of claim 8, further comprising:
connection circuits configured to generate the power supply voltage and driving signals input to the sub-wordline decoders,
wherein the power switch is included in the connection circuit.

11. The memory device of claim 8, further comprising:
a row decoder configured to control the wordline driving circuit,
wherein the power switch is included in the row decoder.

12. The memory device of claim 8, wherein the logic circuit is configured to turn on the power switch during the first time and is configured to turn off the power switch during the second time.

13. The memory device of claim 8, wherein the power switch includes a first power switch, connected to odd wordlines, and a second power switch connected to even wordlines, and
wherein the logic circuit is configured to turn on the first power switch and the second power switch during the first time, and is configured to turn on one of the first and second power switches and turn off the other one of the first and the second power switches during the second time.

14. The memory device of claim 13, wherein the logic circuit is configured to turn on the first power switch and turn off the second power switch when a selected wordline is determined among the odd wordlines, and
the logic circuit is configured to turn off the first power switch and turn on the second power switch when a selected wordline is determined, among the even wordlines.

15. The memory device of claim 8, wherein each of the sub-wordline decoders includes the power switch, and
wherein the logic circuit is configured to turn on the power switch, included in each of the sub-wordline decoders, during the first time and is configured to turn off the power switch included in each of the unselected sub-wordline decoders during the second time.

16. A memory device comprising:
a plurality of memory cells connected to a plurality of wordlines and a plurality of bitlines;
connection circuits configured to generate a driving signal to drive the memory cells;
sub-wordline decoders connected between the connection circuits and the plurality of wordlines and configured to determine a selected wordline and unselected wordlines from the plurality of wordlines; and a logic circuit configured to control the sub-wordline decoders such that a power supply voltage is input to the plurality of wordlines during a first time and to control the sub-wordline decoders such that a driving voltage, higher than the power supply voltage, is input to the selected wordline and the unselected wordlines are floated during a second time subsequent to the first time, wherein the logic circuit is configured to determine a bridge failure between the selected wordline and a first unselected wordline by detecting data of first unselected memory cells connected to the first unselected wordline adjacent to the selected wordline.

17. The memory device of claim 16, further comprising:

a sense amplifier circuit including sense amplifiers connected to the plurality of bitlines and configured to read data from the memory cells, wherein the logic circuit is configured to detect a failure of at least one of the wordlines and the sub-wordline decoders based on data read from the memory cells by the sense amplifier circuit after the second time.

18. The memory device of claim 16, further comprising:

a power switch connected between the sub-wordline decoders and a power line that supplies the power supply voltage, and configured to be turned on and off in response to control of the logic circuit.

* * * * *